United States Patent
Bu et al.

(10) Patent No.: US 8,901,675 B2
(45) Date of Patent: Dec. 2, 2014

(54) CMOS DEVICES AND FABRICATION METHOD

(71) Applicant: Semiconductor Manufacturing International Corp., Shanghai (CN)

(72) Inventors: Weihai Bu, Shanghai (CN); Wenbo Wang, Shanghai (CN); Shaofeng Yu, Shanghai (CN); Hanming Wu, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/714,452

(22) Filed: Dec. 14, 2012

(65) Prior Publication Data
US 2014/0015064 A1  Jan. 16, 2014

(30) Foreign Application Priority Data
Jul. 12, 2012 (CN) .......................... 2012 1 0241829

(51) Int. Cl.
*H01L 21/70* (2006.01)
*H01L 27/092* (2006.01)
*H01L 21/8238* (2006.01)

(52) U.S. Cl.
CPC .......... *H01L 27/092* (2013.01); *H01L 21/8238* (2013.01); *H01L 21/823842* (2013.01)
USPC ............. 257/407; 257/E21.444; 257/E21.453

(58) Field of Classification Search
CPC .................. H01L 21/823842; H01L 29/66871
USPC ........................... 257/E21.444, E21.453, 407
See application file for complete search history.

(56) References Cited

U.S. PATENT DOCUMENTS

| | | | |
|---|---|---|---|
| 2004/0113211 A1* | 6/2004 | Hung et al. .................... | 257/407 |
| 2005/0233527 A1* | 10/2005 | Brask et al. .................... | 438/287 |
| 2007/0077716 A1* | 4/2007 | Chen et al. .................... | 438/300 |
| 2011/0081774 A1* | 4/2011 | Yeh et al. ....................... | 438/591 |

\* cited by examiner

*Primary Examiner* — Ha Tran T Nguyen
*Assistant Examiner* — Aaron Dehne
(74) *Attorney, Agent, or Firm* — Anova Law Group, PLLC

(57) ABSTRACT

A method is provided for fabricating a CMOS device. The method includes providing a semiconductor substrate having a first active region and a second active region. The method also includes forming a first trench on the first active region using a first barrier layer and a second substitute gate electrode layer to protect a gate region on the second active region, followed by forming a first work function layer and a first metal gate in the first trench. Further, the method includes forming a second trench on the second active region using a second barrier layer to protect the first metal gate structure, followed by forming a second work function layer and a second metal gate in the second trench.

20 Claims, 7 Drawing Sheets

CMOS DEVICES AND FABRICATION METHOD

CROSS-REFERENCES TO RELATED APPLICATIONS

This application claims the priority of Chinese patent application No. 201210241829.1, filed on Jul. 12, 2012, the entirety of which is incorporated herein by reference.

FIELD OF THE INVENTION

The present invention generally relates to the field of semiconductor manufacturing technology and, more particularly, relates to CMOS devices and techniques for fabricating high-performance CMOS devices.

BACKGROUND

With the continuously shrinking of the process node of the semiconductor process technology, the conventional metal-oxide-semiconductor (CMOS) device which uses silicon dioxide as a gate dielectric layer and polycrystalline silicon (poly silicon) as a gate electrode layer have encountered problems such as the increase of leakage current and the depletion of the gate electrode layer. In order to solve these problems, materials with a high dielectric constant (high-K) are used to substitute silicon dioxide as the gate dielectric layer, and metals are used to substitute the poly silicon as the gate electrode layer (so called a high K metal gate, HKMG).

The problems faced by CMOS devices, such as high leakage current, depletion of the poly silicon gate and mobility degradation, etc., might be solved by the HKMG process. However, the performance of the CMOS devices fabricated by the HKMG process is often under-expectation, and cannot match design requirements. The disclosed methods and systems are directed to solve one or more problems set forth above and other problems.

BRIEF SUMMARY OF THE DISCLOSURE

One aspect of the present disclosure includes a method for fabricating a CMOS device. The method includes providing a semiconductor substrate having a first active region, a second active region and a plurality of isolation regions. The method also includes forming a first trench on the first active region using a first barrier layer and a second substitute gate electrode layer to protect a gate region on the second active region, followed by forming a first work function layer and a first metal gate in the first trench. Further, the method includes forming a second trench on the second active region using a second barrier layer to protect the first work function layer and the first metal gate, followed by forming a second work function layer and a second metal gate.

Another aspect of the present disclosure includes a CMOS device. The CMOS device includes a semiconductor substrate having a plurality of isolation regions, a first active region and a second active region. The first active region is an active region of NMOS devices and the second active region is an active region of PMOS devices. The CMOS device also includes a plurality of sources and drains inside both the first active region and the second active region of the semiconductor substrate, a substitute gate dielectric layer on the surface of the semiconductor substrate, a third barrier layer on the substitute gate dielectric layer, and an interlayer dielectric layer on the third barrier layer. Further, the CMOS device includes a first metal gate structure on the first active region. The first metal gate consists of a first work function layer, a first metal gate and an interfacial layer. Further, the CMOS device includes a second metal gate structure on the second active region. The second metal gate structure consists of a second work function layer, a second metal gate and an interfacial layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

With respect to the HKMG process, the under-expected performance of the CMOS devices fabricated by a gate-last process of the HKMG process is usually related to their general fabrication process. The general fabrication process of a CMOS device includes: providing a semiconductor substrate, forming a P-type active region and an N-type active region in the semiconductor substrate, and forming a substitute gate electrode layer and an interlayer dielectric layer on the surface of the semiconductor substrate. The surface of the interlayer dielectric layer is leveled with the surface of the substitute gate electrode layer.

The general fabrication process of the CMOS device also includes forming a first trench on the N-type active region and a second trench on the P-type active region, and forming a high-K dielectric layer on the semiconductor substrate to cover bottoms and sidewalls of the first trench and the second trench. Further, the general fabrication process of the CMOS device includes forming a barrier layer to cover only the NMOS device region, and forming a second work function layer on the high-K dielectric layer in the PMOS device region to cover the high-K dielectric layer in the second trench.

Further, the general fabrication process of the CMOS device includes removing the barrier layer covering the NMOS device region and forming a work-function layer of the NMOS devices (i.e., first work function layer) on the surface on the semiconductor substrate. Therefore, the first work function layer not only covers the bottom and sidewall of the high-K layer in the first trench, but also covers the sidewall and the bottom of the second work function layer. In other words, the formed work function layer of the PMOS devices is a multiple-stacked layer consisting of the first work function layer and the second work function layer. Further, the general fabrication process of the CMOS device includes filling the trenches with a metal material to form a first metal gate in the first trench and a second metal gate in the second trench. The structure of the CMOS device formed by the described general fabrication process can be illustrated in FIG. 1.

Figure 1:
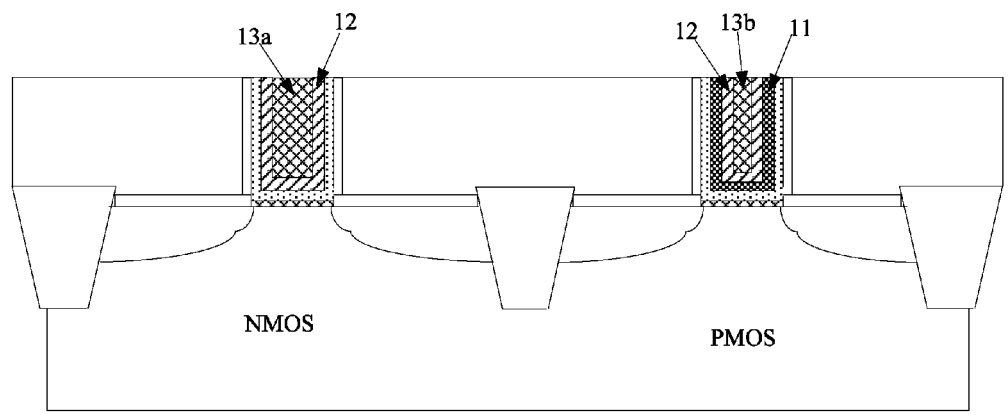
FIG. 1 illustrates the structure of an existing CMOS device.

As shown in FIG. 1, because the work function layer of the PMOS device is a multiple-stacked layer consisting of the first work function layer 12 and the second work function layer 11, the filling area of the second metal gate 13b becomes smaller and the amount of material of the second metal gate is significantly reduced compared to the first metal gate, thus the filling capability of the second metal gate 13b is reduced. Because the width of the second metal gate 13b is decreased, the process requirements for subsequently forming vias and metal interconnect are increased, and it may cause the decrease of the yield of such CMOS devices.

Further, it is necessary to use a twice-film-forming process to form the work function layer of the PMOS device, thus the risk of cross contamination is increased in the PMOS device region. The twice-film-forming process herein may refer to that there are forming steps of other structures during forming the work function layers of the PMOS device. For example, the first work function layer 12 of the NMOS device is also formed between the metal gate 13b and the second work function layer 11 of the PMOS device as in the existing process of CMOS device shown in FIG. 1.

Figure 11:
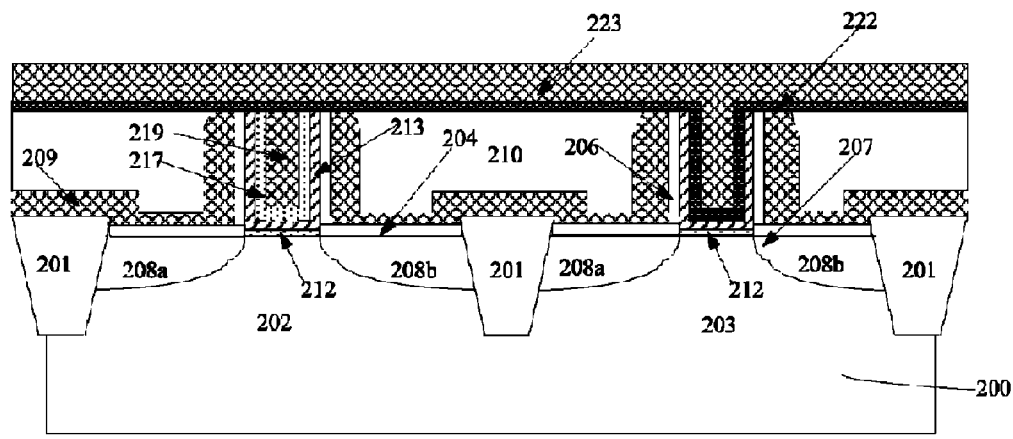
Figure 12:
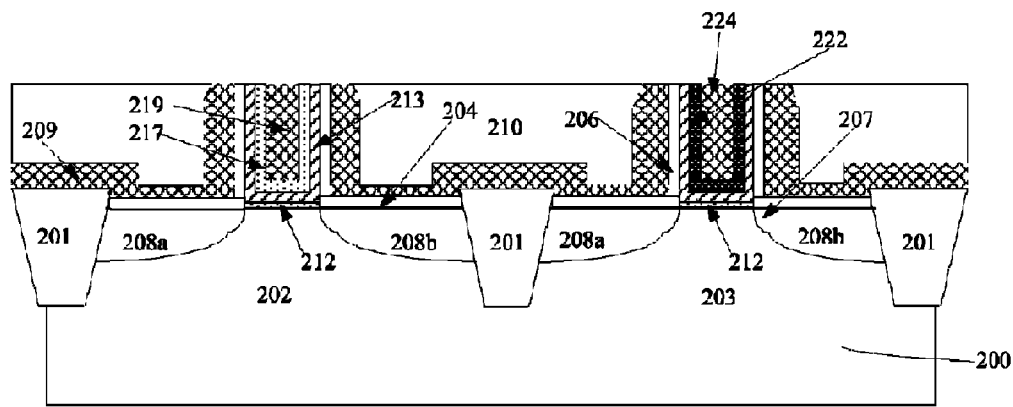
Figure 13:
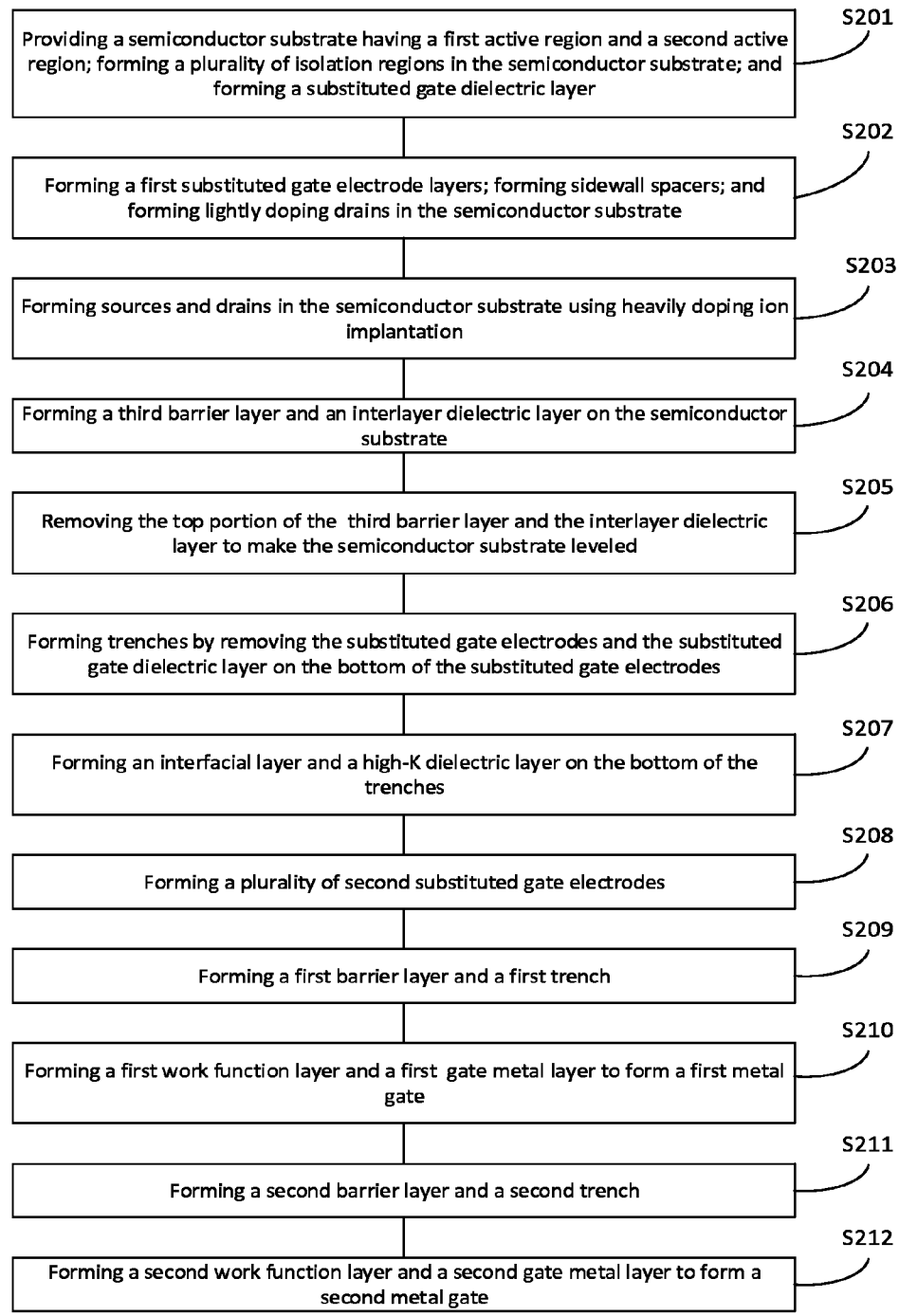
FIG. 13 illustrates an exemplary fabrication process of a CMOS device consistent with the disclosed embodiments.

FIG. 13 illustrates an exemplary fabrication process of a CMOS device consistent with the disclosed embodiments. FIGS. 2-12 illustrate the semiconductor structures corresponding to certain stages of the exemplary fabrication process.

Figure 2:
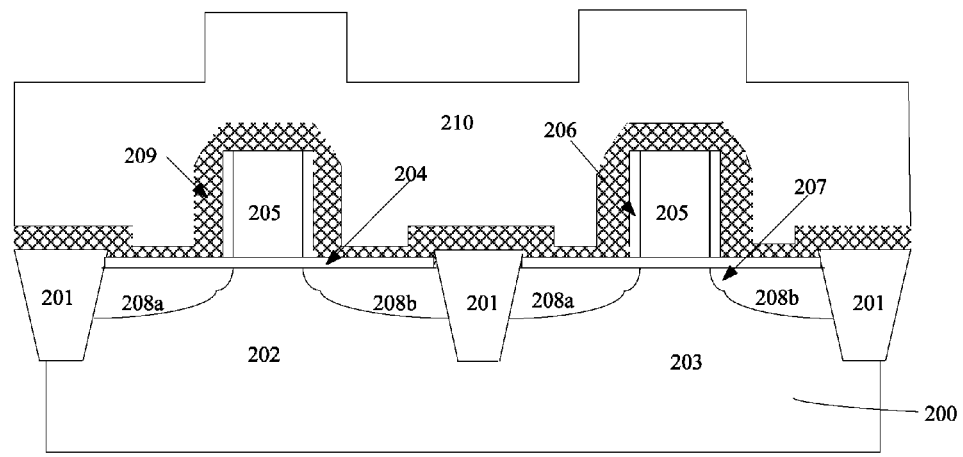
FIGS. 2-12 illustrate semiconductor structures corresponding to certain stages of an exemplary fabrication process of a CMOS device consistent with the disclosed embodiments.

As shown in FIG. 13, at the beginning of the fabrication process, a semiconductor substrate with certain structures is provided (S201). FIG. 2 shows a corresponding semiconductor device.

As shown in FIG. 2, a semiconductor 200 is provided. The semiconductor substrate 200 may include any appropriate type of semiconductor material, such as single crystal silicon, poly silicon, amorphous silicon or silicon germanium. The semiconductor substrate 200 may also include any compound semiconductor material, such as carborundum, indium antimonide, lead telluride, indium arsenide, indium phosphide, gallium arsenide or gallium antimonide, alloy semiconductor or a combination thereof. Further, the semiconductor substrate 200 may include any other appropriate material, such as epitaxially grown materials and/or silicon on insulator (SOI). In one embodiment, the semiconductor substrate 200 is silicon. The semiconductor substrate 200 may also provide a base for subsequent processes and structures.

After providing the semiconductor substrate 200, a plurality of isolation regions 201 may be formed inside the surface of the semiconductor substrate 200. A first active region 202 and a second active region 203 may be formed inside the surface of the semiconductor substrate 200 between the isolation regions 201. The term inside the surface of the semiconductor substrate 200 may refer to the region underneath the surface of the semiconductor substrate 200, which belongs to the semiconductor substrate 200. The first active region 202 and the second active region 203 may be isolated by the isolation regions 201. The isolation regions 201 may be made of any appropriate material, such as silicon nitride, siliconoxynitride, siliconoxycarbide, amorphous carbon or carbonsiliconoxynitride, etc.

An isolation region 201 may be a shallow trench insolation (STI) region formed by a high density plasma chemical vapor deposition process (HDPCVD), and/or a local oxidation of silicon (LOCOS) isolation region formed by a thermal oxidation process. The isolation regions 201 may also be formed by other appropriate processes, such as a flowable chemical vapor deposition process (FCVD), etc.

In one embodiment, the isolation regions 201 are STI regions, and the first active region 202 may be a P-type active region and the second active region 203 may be an N-type active region. When a P-type doping process is used to form the P-type active region, the dopant may be any appropriate trivalent ion, such as boron ion, etc. When an N-type doping process is used to form the N-type active region, the dopant may be any appropriate pentavalence ion, such as phosphorous ion, or arsenic ion, etc.

Referring to FIG. 2, after forming the isolation regions 201, the first active region 202 and the second active region 203, a substitute gate dielectric layer 204 may be formed on the surface of the semiconductor substrate 200. The term on the surface of the semiconductor substrate 200 may refer to the region over the semiconductor substrate 200, which does not belong to the semiconductor substrate 200.

The substitute gate dielectric layer 204 may be made of any appropriate type of isolation material, such as silicon oxide, silicon nitride, siliconoxynitride, or a combination thereof. When silicon oxide is used to form the substitute gate dielectric layer 204, the substitute gate dielectric layer 204 may be referred as a gate oxide. Various processes may be used to form the substitute gate dielectric layer 204, such as a thermal oxidation process, a chemical vapor deposition process (CVD) or a physical vapor deposition process (PVD), etc.

Returning to FIG. 13, after forming the substitute gate dielectric layer 204, a first substitute gate electrode layer may be formed on the surface of the substitute gate dielectric layer 204 to form substitute gate structures (S202). The corresponding semiconductor structure is illustrated in FIG. 2.

As shown in FIG. 2, a first substitute gate electrode layer 205 (may be referred as a dummy poly gate) are formed on the substitute gate dielectric layer 204. The fabrication process of the first substitute gate electrode layer 205 may include depositing a poly silicon layer on the substitute gate dielectric layer 204 and spin-coating a layer of photoresist onto the poly silicon layer. An anti-reflection layer may be formed between the photoresist layer and the poly silicon layer to reduce the unnecessary reflection to increase the exposure resolution. The anti-reflection layer may be made of appropriate organic material or inorganic material.

The fabrication process of the first substitute gate electrode layer 205 may also include exposing the photoresist layer using a photo mask with patterns of the first substitute gate electrode layer 205. The photoresist layer with the patterns of the first substitute gate electrode layer 205 may be formed after a photoresist development process. Further, the fabrication process of the first substitute gate electrode layer 205 may include removing a portion of the poly silicon layer without the photoresist layer using an etching process using the photoresist layer with the patterns as a mask to form the first substitute gate electrode layer 205. The etching process may be a dry etching process such as a plasma etching process or an ion beam etching process, etc. The etching process may be also a wet etching process.

Various processes may be used to form the poly silicon layer, such as a chemical vapor deposition process (CVD) or a physical vapor deposition (PVD) process. In one embodiment, the poly silicon layer is formed using the CVD process. The thickness of the poly silicon layer may determine the height of the first substitute gate electrode layer 205, and the thickness of the poly silicon layer may also be the height of subsequently formed metal gates.

Further, after forming the first substitute gate electrode layer 205, sidewall spacer 206 consisting a first sidewall spacer and a second sidewall spacer may be formed around the first substitute gate electrode layer 205 as shown in FIG. 2. The fabrication process of the first sidewall spacer includes forming a thin first silicon oxide layer on the surface of the substitute gate dielectric layer 204 and around the substitute gate electrode layer 205 (not shown), and forming a layer of first silicon nitride on the thin first silicon oxide layer (not shown). Certain fabrication process may be used to deposit the oxide layer and the silicon nitride layer, such as a CVD process or a PVD process, etc.

The fabrication process of the first sidewall spacer may also include performing an etch back process to the first silicon nitride layer to form the first sidewall spacer. After etching the first silicon nitride layer of the first sidewall spacer, the first silicon oxide layer of the first sidewall spacer may be still on the surface of the semiconductor substrate 200. That is, the first silicon oxide layer and a portion of the first silicon nitride layer may still on sidewalls of the substitute gate electrode layer 205, and the first silicon oxide layer may be still on the top of the first substitute gate electrode layer 205 (not shown). In other words, the first sidewall spacer may be a double-stacked layer consisting of the first silicon oxide layer and a portion of the first silicon nitride layer on the sidewalls of the substitute gate electrode layer 205. Certain etching process may be used as the etch back process, such as a plasma etching process, an ion beam etching process or a wet chemical etching process, etc.

Further, after forming the first sidewall spacer, lightly doping drains (LDDs) 207 may be formed inside the semiconductor substrate 200 as shown in FIG. 2. Various methods may be used to form the LDDs 207. In one embodiment, a double sidewall spacer method, i.e., using a sidewall spacer like the first sidewall spacer consisting of two stacked layers as a mask, is used to form the LDDs 207. The LDDs 207 may be formed by performing a lightly doping ion implantation process on the semiconductor substrate 200 using the first sidewall spacer as a mask. Certain type of ion may be used to dope the semiconductor substrate 200. In one embodiment, when a p-type ion implantation process is used to form a P-type metal-oxide-semiconductor (PMOS) transistor region, the P-type ion may be boron ion, and/or other appropriate ions; when an N-type ion implantation process is used to form an N-type MOS (NMOS) transistor region, the N-type ion may be phosphorus ion or arsenic ion, etc.

Further, after the lightly doping ion implantation process, the semiconductor substrate 200 may be annealed. The annealing process may cause implanted ions of the LDDs 207 to diffuse uniformly along both vertical and lateral directions. In certain embodiment, the annealing process may be performed simultaneously with another annealing process of later-formed sources and drains.

After forming the first sidewall spacer and the LDDs 207, a second sidewall spacer may be formed on the semiconductor substrate 200 (not shown). The fabrication process of the second sidewall spacer may include forming a second silicon oxide layer on the semiconductor substrate 200 and around the first sidewall spacer, and forming a second silicon nitride layer on the second silicon oxide layer (not shown). Further, the fabrication process of the second sidewall spacer may include performing an etch back process on the second silicon nitride layer. The second silicon oxide layer and a portion of the second silicon nitride layer on the first sidewall spacer may form the second sidewall spacer after the etch back process. That is, the second sidewall spacer may be a double-stacked layer consisting of the second silicon oxide layer and the second silicon nitride layer. Therefore, the sidewall spacer 206 may consist of the first sidewall spacer and the second sidewall spacer.

Various deposition processes may be used to form the oxide layer and the silicon nitride layer, such as a CVD process, a PVD process, or a thermal oxidation process, etc.

Various etching process may be used as the etch back process, such as a plasma etching process, an ion beam etching process, or a wet etching process, etc.

In one embodiment, the sequential structures of the sidewall spacer 206 from inside to outside are the silicon oxide layer of the first sidewall spacer, the silicon nitride layer of the first sidewall spacer, the silicon oxide layer of the second sidewall spacer, the silicon nitride layer of the second sidewall spacer. In other embodiments, the sidewall spacer 206 may be formed by a single sidewall spacer process, i.e., the sidewall spacer 206 may be made of only one of silicon oxide or silicon nitride. After forming the sidewall spacer 206, the substitute gate dielectric layer 204 may still remain intact.

For illustrative purposes, the substitute gate structure may include the substitute gate dielectric layer 204, the first substitute gate electrode layer 205 and the sidewall spacer 206.

Returning to FIG. 13, after forming the sidewall spacer 206, sources and drains may be formed inside the semiconductor substrate 200 (S203). A corresponding semiconductor structure is shown in FIG. 2.

As shown in FIG. 2, sources 208a and drains 208b are formed inside the semiconductor substrate 200. The sources 208a and the drains 208b may be formed by performing a heavy doping implantation process on the semiconductor substrate 200 using the substitute gate structure as a mask. The depth of the sources 208a and the drains 208b is greater than the depth of the LDDs 207. Various types of ions may be used in the heavy doping ion implantation process. In one embodiment, when a P-type ion implantation process is used to form a PMOS transistor region, the P-type ion may be boron ion, or other appropriate ions; when an N-type ion implantation process is used to form an NMOS transistor region, the N-type ion may be phosphorus ion or arsenic ion, etc. Further, after the heavy doping implantation process, a thermal annealing process may be performed to cause the implanted ions to diffuse uniformly along both vertical and lateral directions.

Alternatively, the sources 208a and the drains 208b may be formed by an epitaxial growth process. For example, the sources 208a and the drains 208b of PMOS devices may be made of silicon germanium formed by the epitaxial growth process; the sources 208a and drains 208b of NMOS devices may be made of silicon/silicon carbide formed by the epitaxial growth process.

Returning to FIG. 13, after forming the sources 208a and the drains 208b, a third barrier layer may be formed on the substitute gate dielectric layer 204 (S204). The corresponding semiconductor structure is shown in FIG. 2.

As shown in FIG. 2, after forming the sources 208a and the drains 208b, a third barrier layer 209 is formed on the surface of the substitute gate dielectric layer 204. The third barrier layer 209 may also cover the surface of the first substitute gate electrode layers 205. The third barrier layer 209 may be formed by a CVD process or a PVD process. The third barrier layer 209 may be made of any appropriate isolation material, such as silicon nitride or silicon oxide, etc. In one embodiment, the third barrier layer 209 is made of silicon nitride.

Further, an interlayer dielectric layer 210 may be formed on the third barrier layer 209 by a CVD process or a PVD process. The interlayer dielectric layer 210 herein may refer to a zero order interlayer dielectric layer ILD0. The interlayer dielectric layer 210 may be made of any appropriate isolation material, such as silicon oxide, silicon oxynitride, or silicon nitride, etc.

Figure 3:
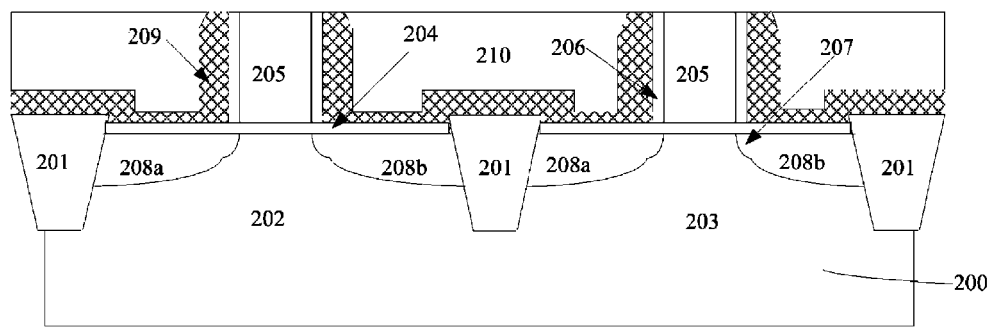

Returning to FIG. 13, after forming the third barrier layer 209 and the interlayer dielectric layer 210, top portions of the third barrier layer 209 and the interlayer dielectric layer 210 may be removed to expose the first substitute gate electrode layer 205 (S205). FIG. 3 shows a corresponding semiconductor structure.

As shown in FIG. 3, a top portion of the third barrier layer 209 and a top portion of the interlayer dielectric layer 210 are removed by a chemical mechanical polishing process (CMP). The CMP process may be stopped when the top surface of the first substitute gate electrode layers 205 is exposed. After the CMP process, the portion of the silicon oxide of the sidewall spacer 206 formed on the top surface of the first substitute gate electrode layer 205 during the fabrication process of the sidewall spacer 206 may also be removed, the top surface of the interlayer dielectric layer 210 is leveled with the top surface of the first substitute gate electrode layer 205.

In one embodiment, the third barrier layer 209 may be used to reduce the excessive damage of subsequent CMP processes on the surface of the first substitute gate electrode layer 205, and may ensure the accuracy of the height of the first substitute gate electrode layer 205. Further, the third barrier layer 209 may be also used as a stress relief layer for subsequently formed vias and metal interconnections to protect the semiconductor substrate 200. Specifically, during the CMP process of the third barrier layer 209 and the interlayer dielectric layer 210, a relatively high polishing speed may be used to polish the interlayer dielectric layer 210; when the polished surface reaches the surface of the third barrier layer 209, a relatively low speed may be used to polish the third barrier layer 209 until the top surface of the first substitute gate electrode layer 205 is exposed.

In order to ensure the first substitute gate electrode layer 205 to be completely exposed, the third barrier layer 209 may be over polished. Because the polishing rate of the third barrier layer 209 may be relatively low, the damage of the over polishing may be less severe.

Various types of polishing suspensions may be used for the CMP process such as a silicon oxide polishing suspension or a cerium oxide polishing suspension. The polishing suspension may have a selective planarization rate, i.e., the planarization rate ratio of the silicon oxide and silicon nitride is greater than 1. The selective planarization rate may ensure that a portion of the silicon nitride barrier layer 209 and a portion of the silicon oxide ILD0 layer 210 over the first substitute gate electrode layer 205 may be simultaneously polished away. The particle size of the silicon oxide polishing suspension may be in a range of approximately 1 nm~100 nm. The advantage of the silicon oxide suspension may include good particle dispersion, active chemical reaction and easy after-cleaning. The particle size of the cerium oxide polishing suspension may be in a range of approximately 10 nm~20 nm. The advantage of the cerium oxide polishing suspension may include high polishing rate, high material removing rate and less damage to the polished surface.

Because the interlayer dielectric layer 210 and the first substitute gate electrode layer 205 are made of different materials, in certain embodiments, the third barrier layer 209 may be omitted. When the third barrier layer 209 is not used, a polishing suspension with a selective planarization rate ratio of poly silicon and the ILD0 layer greater than 1 may be used. Other appropriate polishing suspensions may also be used.

Figure 4:
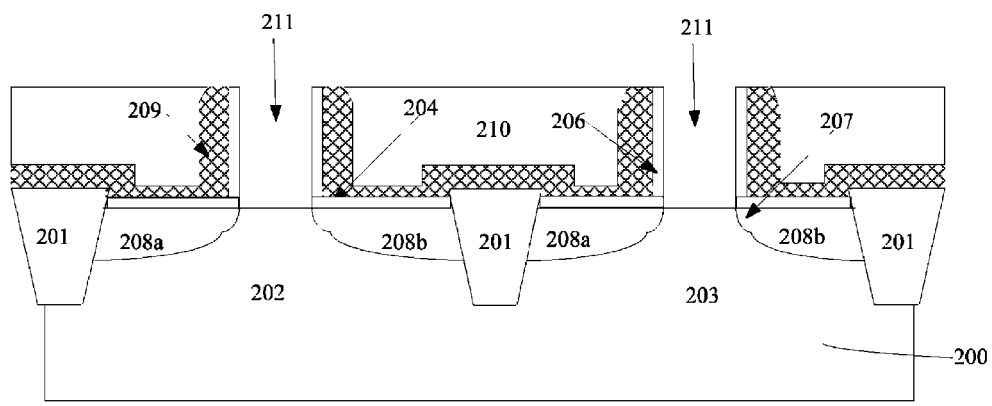

Returning to FIG. 13, after the CMP process, trenches may be formed by removing the first substitute gate electrode layer 205 and portions of the substitute gate dielectric layer 204 under the substitute gate electrode layer 205 (S206). FIG. 4 shows a corresponding semiconductor structure.

As shown in FIG. 4, after the CMP process, trenches 211 are formed by removing the first substitute gate electrode layer 205 using the interlayer dielectric layer 210 as a mask. The portion of substitute gate dielectric layer 204 on the bottom of the trenches 211 may be removed simultaneously with the first substitute gate electrode layer 205, or the portions of substitute gate dielectric layer 204 may be removed by a separated process.

The first substitute gate electrode layer 205 and the substitute gate dielectric layer 204 on the bottom of the trenches 211 may be removed by any appropriate method such as a wet etching process, or a dry etching process such as a plasma etching process or an ion beam etching process, etc.

Returning to FIG. 13, after forming the trenches 211, interfacial layers may be formed on the bottom of the trenches 221 (S207). The corresponding semiconductor structure is shown in FIG. 5.

Figure 5:
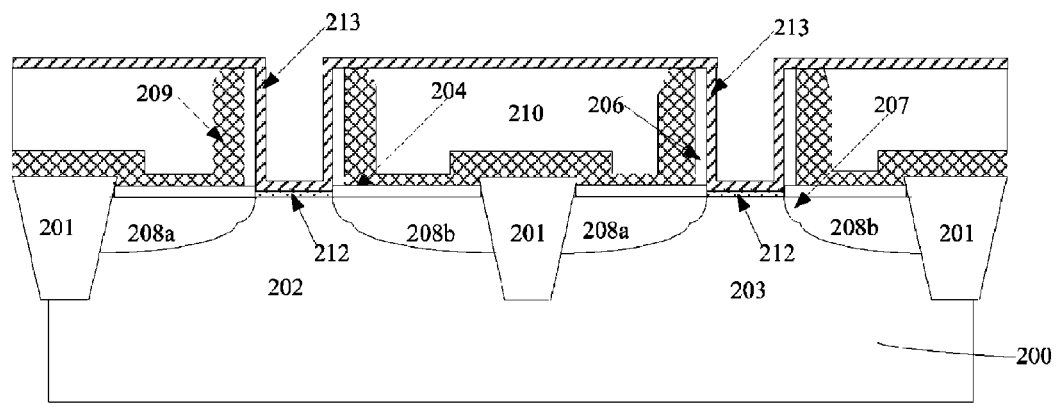

As shown in FIG. 5, after forming the trenches 211, an interfacial layer 212 is formed on the bottom each of the trenches 211. The interfacial layer 212 may be made of any appropriate material, such as silicon oxide, silicon nitride, silicon oxynitride, or a combination thereof. A thickness of the interfacial layer 212 may be in a range of approximately 0.1 nm~2 nm. In certain embodiments, the thickness of interfacial layer 212 may be in a range of approximately 0.1 nm~1 nm. In certain other embodiments, the thickness of the interfacial layer 212 may be in a range of approximately 0.5 nm~1.5 nm.

The existence of the interfacial layer 212 may help to preserve an interfacial state characteristic and form a desired electrical characteristic interface. Further, the interfacial layer 212 may closely connect with channels of a transistor. Therefore, the thickness and quality of the interfacial layer 212 may affect the device performance.

In certain embodiments, a chemical cleaning process may be performed to clean residue photoresist, impurity particles and native oxide layer on the bottom of the trenches 211 before forming the interfacial layer 212. The chemical cleaning process may ensure the quality of the interfacial layers 212. The chemical cleaning process may include a plasma ashing process or a wet chemical cleaning process.

Further, because a high temperature process may affect the quality of the sources 208a and the drains 208b if the high temperature process is performed after forming the sources 208a and the drains 208b, a high temperature process (>500° C.) may be unable to be used to form the interfacial layer 212.

In one embodiment, the interfacial layer 212 is made of silicon oxide, and may be formed by a chemical oxidation process. The chemical oxidation process for forming the interfacial layer 212 may be to soak the semiconductor substrate 200 into an oxidative liquid to oxide the surface of the semiconductor substrate 200 on the bottom of the trenches 211. The oxidative liquid may include any one of nitric acid solution, perchoric acid solution, sulfuric acid solution, hydrogenperoxide, a mixture solution of hydrochloric acid and hydrogen peroxide, ozone water solution, a mixture solution of ammonia and hydrogen peroxide, a mixture solution of nitric acid and sulfuric acid, aqua regia and boiling water, etc.

When ozone water solution is used as the oxidation liquid, the chemical oxidation process for forming the interfacial layer 212 may include soaking the semiconductor substrate 200 into a water solution of ozone in a water bath or an oil bath to form a thin oxide layer, followed by drying the semiconductor substrate 200 using isopropyl alcohol or a spinning dry process. The ozone concentration of the chemical oxidation process may be in a range of approximately 1%~70%; the temperature of the water bath or the oil bath may be lower than 200° C. For example, the temperature of the water bath or the oil bath may be in a range of approximately 50° C.~180° C.

Because the interfacial layer 212 is formed on the bottom of the trenches 211, the chemical oxidation process may ensure the bottom of the trenches 211 to completely and uniformly contact with the oxidative liquid, therefore ensure that the silicon oxidation layer may be formed on any corner of the bottom of the trenches 211, and the thickness of the interfacial layer 212 may be uniform too. Further, the chemical oxidation process itself may have a saturation limitation, thus it may ensure the formed silicon oxide layer is very thin to match the thickness requirement of the interfacial layer 212. Further, the temperature of the chemical oxidation process for forming the interfacial layer 212 may be very low, for example, it may be lower than 200° C., thus the chemical oxidation process may have insignificant effect on the structure and quality of the sources 208a and the drains 208b inside the semiconductor substrate 200.

In other embodiment, the interfacial layer 212 may be formed by an atomic layer deposition process (ALD). Because a high temperature process, e.g., higher than 500° C., may affect the quality of the sources 208a and drains 208b, the reaction temperature of the ALD process may be lower than 500° C. Other processes may also be used to form the interfacial layer 212.

Further, as show in FIG. 5, after forming the interfacial layer 212, a high-K dielectric layer 213 may be formed on sidewalls and bottoms of the trenches 211. Various processes may be used to form the high-K dielectric layer 213, such as a CVD process, a PVD process, or a flowable CVD process (FCVD), etc. The thickness of the high-K dielectric layer 213 may be in a range of approximately 10 Å~30 Å. The high-K dielectric layer 213 may be made of at least one of hafnium dioxide, hafnium silicate, lanthanum oxide, lanthanum aluminum oxide, zirconium oxide, zirconium silicate, tantalum oxide, titanium oxide, barium strontium titanate, barium titanate, strontium titanate, yttrium oxide, lead scandium tantalite and lead zinc niobate, etc. In one embodiment, the high-K dielectric layer 213 is hafnium dioxide.

Figure 6:
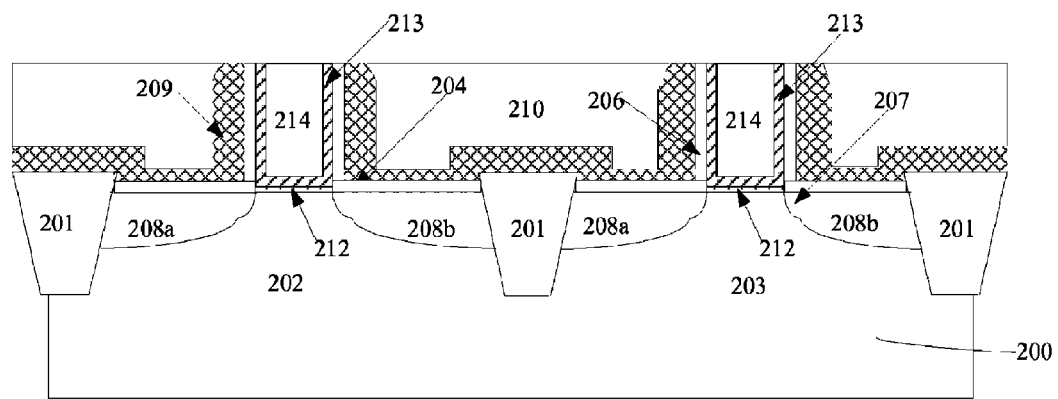

Returning to FIG. 13, after forming the high-K dielectric layer 213, a second substitute gate electrode layer may be formed (S208). FIG. 6 shows a corresponding semiconductor structure.

As shown in FIG. 6, a second substitute gate electrode layer 214 is formed on the high-K dielectric layer 213, and the top surface of the second substitute gate electrode layer 214 is leveled with the top surface of the interlayer dielectric layer 210. Various processes may be used to form the second substitute gate electrode layer 214, such as a CVD processor a PVD process, etc. The second substitute gate electrode layer 214 may be made of any appropriate material, such as poly silicon, aluminum or copper, etc.

In one embodiment, the second substitute gate electrode layer 214 is made of poly silicon (so called a dummy poly gate). The fabrication process of the second substitute gate electrode layer 214 may include completely filling the trenches 211 with poly silicon to form a poly silicon layer, followed by polishing away the poly silicon and the high-K dielectric layer 213 on the surface of the interlayer dielectric layer 210 to make the surface of the substrate 200 leveled, i.e., the top surface of the second substitute gate electrode layer 214 is leveled with the top surface of the interlayer dielectric layer 210, then the second substitute gate electrode layer 214 is formed. The second substitute gate electrode layer 214 may used to independently form later-formed HKMG structures in the NMOS device region and the PMOS device region.

Figure 7:
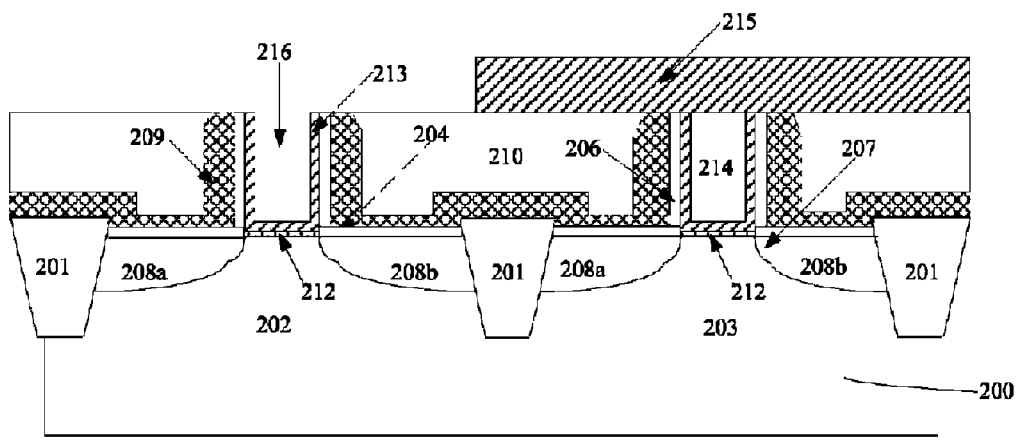

Returning to FIG. 13, after forming the second substitute gate electrode layer 214, a first barrier layer may be formed (S209). FIG. 7 shows a corresponding semiconductor structure.

As shown in FIG. 7, a first barrier layer 215 is formed on the second substitute gate electrode layer 214 on the second active region 203, i.e., the first barrier layer 215 may only cover the substitute gate electrode layer on the second region 203. The first barrier layer 215 may be made of any appropriate material, such as silicon oxide, silicon nitride, or photoresist, etc. In one embodiment, the first barrier layer 215 is a layer of photoresist to reduce the fabrication steps and cost. When the photoresist layer is used as the first barrier layer 215, the first barrier layer 215 may be formed by spin-coating the photoresist on the semiconductor substrate 200, followed by exposing the photoresist layer using a photo mask having patterns of the second active region 203, and developing, then the first barrier layer 215 is formed.

Further, after forming the first barrier layer 215, a second trench 216 may be formed by removing the second substitute gate electrode 214 on the first active region 202, as shown in FIG. 7. The second substitute gate electrode 214 on the first active region 202 may be removed by any appropriate process such as a plasma etching process, an ion beam etching process or a wet chemical etching process, etc.

The purpose of forming the first barrier layer 215 may be to prevent the second substitute gate electrode 214 on the second active region 303 from being damaged during the process of forming the first trench 216. Therefore, the first barrier layer 215 may only need to cover the second substitute gate electrode 214 on the second active region 203 for a minimum size of covering region; and the first barrier layer may only need to expose the second substitute gate electrode 214 on the first active region 202 for a maximum size of covering region. In one embodiment, the cover region of the first barrier layer 215 may be adjusted to reduce the exposure resolution requirement.

Further, after forming the first trench 216, the first barrier layer 215 may be removed. The first barrier layer 215 may be removed by any appropriate process, such as a wet chemical cleaning process, a reactive ion etching process, or an ion beam etching process. The contamination particles and the native oxide layer on the surface of the substrate may be cleaned by the same process as removing the first barrier layer 215, and/or a separated process, such as a plasma ashing process, or a wet chemical cleaning process, etc.

Figure 8:
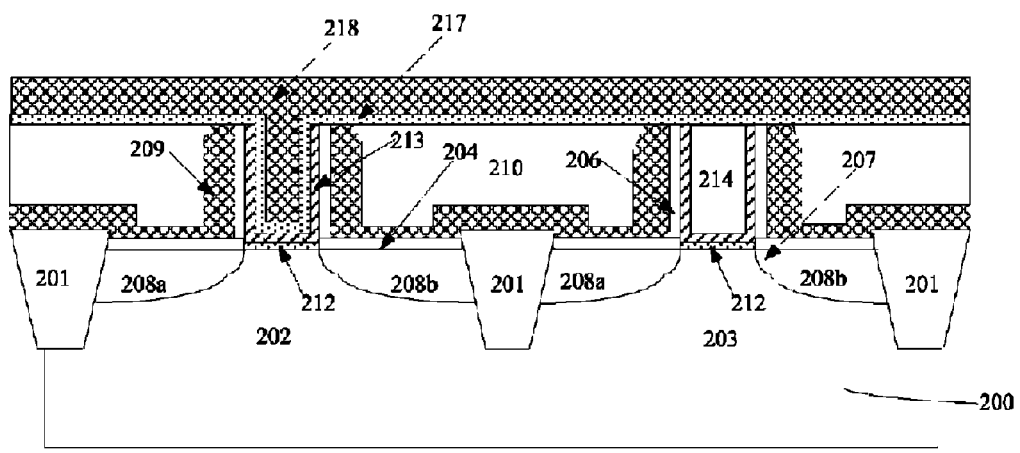

Returning to FIG. 13, after removing the first barrier layer 215, a first work function layer may be formed on the bottom and sidewall of the first trench 216 (S210). FIG. 8 shows a corresponding semiconductor structure.

As shown in FIG. 8, a first work function layer 217 is formed on the bottom and the sidewall of the first trench 216. That is, the first work function layer 217 may cover the entire surface of the semiconductor substrate 200 including the surface of the high-K dielectric layer 213 in the first active region 202, the surface of the interlayer dielectric layer 210 and the surface of the second substitute gate electrode 214 in the second active region 203.

The first work function layer 217 may be formed by any appropriate process, such as a CVD process or a PVD process, etc. The first work function layer 217 may be made of any one of titanium nitride, thallium nitride, titanium aluminum alloy, or a combination thereof. A thickness of the first work function layer 217 may be in a range of approximately 2 nm~20 nm.

Further, as shown in FIG. 8, a first gate metal layer 218 may be formed on the first work function layer 217. The first gate metal layer 218 may completely fill the first trench 216. The first gate metal layer 218 may be formed by any appropriate process, such as a CVD process, a PVD process, or a FCVD process, etc. The first gate metal layer 218 may be made of any one of aluminum, copper, silver, gold, platinum, nickel, titanium, thallium, tantalum, tungsten, tungsten silicide, titanium tungsten alloy, titanium nitride, thallium nitride, thallium carbide, nickel platinum ally and thallium nitrate silicate, etc.

Figure 9:
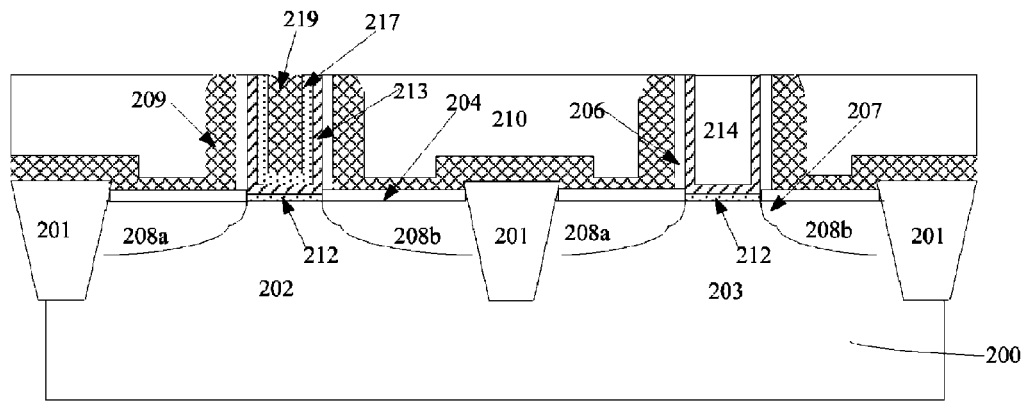

Further, as shown in FIG. 9, after forming the gate metal layer 218, a CMP process may be performed to form a first metal gate 219. The CMP process may be used to polish away a portion of the first work function layer 217 on the interlayer dielectric layer 210 and a portion of the first gate metal layer 218 on the interlayer gate dielectric layer 210, and make the surface of the semiconductor substrate 200 flat, i.e., the top surfaces of the work function layer 217 and the metal gate 219 are leveled with the top surface of the interlayer dielectric layer 210.

As described above, because of a barrier function of the second substitute gate electrode 214 on the second active region 203, materials of the first work function layer 217 and the first gate metal layer 218 may be unable to be filled in a gate region of the PMOS devices. In addition, it may be unlikely to damage the gate region of the PMOS device during the CMP process.

Figure 10:
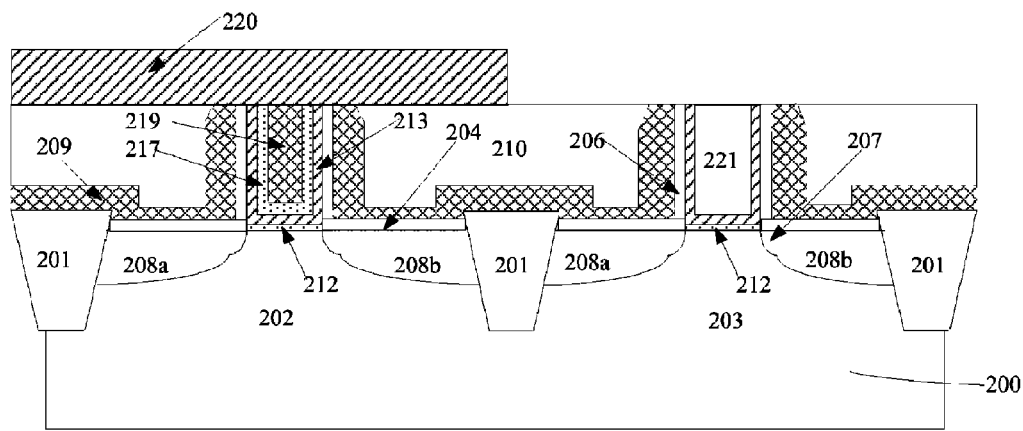

Returning to FIG. 13, after forming the first metal gate 219, a second barrier layer may be formed on the top of the first active region 202 (S211). FIG. 10 shows a corresponding semiconductor structure.

As shown in FIG. 10, a second barrier layer 220 is formed on the top of the first active region 202, i.e., the second barrier layer 220 may only cover a gate region of the NMOS devices in the first active region 202. That is, the second barrier layer may only cover the top of the first metal gate 219 and the first work function layer 217. The second barrier layer 220 may be made of any appropriate material, such as silicon oxide, silicon nitride, or photoresist etc. In one embodiment, the second barrier layer 220 is a layer of photoresist to reduce the fabrication steps and cost. When the photoresist layer is used as the second barrier layer 220, the second barrier layer 220 may be formed by spin-coating the photoresist on the semiconductor substrate 200, followed by exposing the photoresist layer using a photo mask having patterns of the first active region 202, and developing, then the second barrier layer 220 is formed.

Further, after forming the second barrier layer 220, a second trench 221 may be formed by removing the second substitute gate electrode 214 on the second active region 203 as shown in FIG. 10. The second substitute gate electrode 214 on the second active region 203 may be removed by any appropriate process, such as a plasma etching process, an ion beam etching process, or a wet chemical etching process, etc.

The purpose of forming the second barrier layer 220 may be to prevent the first metal gate 219 from being damaged during the process of forming the second trench 221. Therefore, the second barrier layer 220 may only need to cover the gate region on the first active region 203 as a minimum size of covering region, and the second barrier layer 220 may only need to expose the gate region on the second active region 203 as a maximum size of covering region. In one embodiment, the covering region of the second barrier layer 220 may be adjusted to reduce the exposure requirement.

After forming the second trench 221, the second barrier layer 220 may be removed. The second barrier layer 220 may be removed by any appropriate process, such as a wet chemical cleaning process, a reactive ion etching process, or an ion beam etching process. The contamination particles and the native oxide layer on the surface of the substrate may be cleaned by the same process as removing the second barrier layer 220, and/or a separated process, such as a plasma ashing process, or a wet chemical cleaning process, etc.

Returning to FIG. 13, after removing the second barrier layer 220, a second work function layer may be formed on the bottom and the sidewall of the second trench 221 (S212). FIG. 11 shows a corresponding semiconductor structure.

As shown in FIG. 11, a second work function layer 222 is formed on the bottom and the sidewall of the second trench 221. That is, the second work function layer 221 may cover the whole surface of the semiconductor substrate 200 including the surface of the high-K dielectric layer 213 in the second active region 203, the surface of the interlayer dielectric layer 210 and the top surface of the metal gate 219. The second work function layer 222 may be formed by any appropriate process, such as a CVD process or a PVD process, etc. The second work function layer 222 may be made of any one of titanium nitride, thallium nitride or a combination thereof. The thickness of the second work function layer 222 may be in a range of approximately 2 nm~20 nm.

In one embodiment, the first work function layer 217 may refer to a work function layer of the NMOS devices, and the second work function layer 222 may refer to a work function layer of the PMOS devices. The first function layer 217 and the second work function layer 222 may be made of different materials, or may be made of a same material. In one embodiment, the first function layer 217 and the second work function layer 222 are made of different materials.

In another embodiment, the first work function layer 217 and the second work function layer 222 may be multiple-stacked layers consisting of multiple layers of materials. For example, when the first function layer 217 and the second work function layer 222 are made of different materials, the multiple-stacked layer of the first work function layer 217 may sequentially include a titanium nitride layer and a thallium nitride layer from bottom to top, and the multiple-stacked layer of the second function layer 222 may sequentially include a thallium nitride layer and a titanium nitride layer from bottom to top.

Further, as shown in FIG. 11, a second gate metal layer 223 may be formed on the second work function layer 222. The second gate metal layer 223 may completely fill the second trench 221. The second gate metal layer 223 may be formed by any appropriate process, such as a CVD process, a PVD process, or a FCVD process, etc. The second gate metal layer 223 may be made of any one of aluminum, copper, silver, gold, platinum, nickel, titanium, thallium, tantalum, tungsten, tungsten silicide, titanium tungsten alloy, titanium nitride, thallium nitride, thallium carbide, nickel platinum ally and thallium nitrate silicate, etc.

The first gate metal layer 218 and the second gate metal layer 223 may be made of different materials, or maybe a same material. In one embodiment, the first gate metal layer 218 and the second gate metal layer 223 are made of a same material. In addition, the first metal gate layer 218 and the second metal gate layer 223 may be multiple-stacked layers made of multiple layers of different metal materials.

As described above, the first barrier layer 215 and the second barrier layer 220 may be removed before forming the first work function layer 212, the first gate metal layer 218, the second work function layer 222 and the second gate metal layer 223, the surface of the semiconductor substrate 200 may be ensured to be leveled to reduce the process difficulties of the subsequent CMP processes.

Further, as shown in FIG. 12, after forming the second gate metal layer 223, a CMP process may be performed to form a second metal gate 224. The CMP process may be used to polish away a portion of the second work function layer 222 on the interlayer dielectric layer 210 and a portion of the second gate metal layer 223 on the second work function layer 222, and to make the surface of the semiconductor substrate 200 flat, i.e., the top surfaces of the second work function layer 222 and the metal gate 224 are leveled with the top surface of the interlayer dielectric layer 210.

After forming the second metal gate 224, further CMOS processes, such as a metal interconnection, etc., may be performed. The details for subsequent processes are omitted.

In the disclosed embodiments, the first work function layer 217 and the second work function layer 222 may all be formed during once-forming processes. The term once-forming process herein may refer to that there may be no process of forming other thin films or structures during forming the first work function layer 217 or the second work function layer 222, and the first work function layer 217 or the second work function layer 222 is formed by continuous deposition processes. Therefore, the thicknesses of the first work function layer 217 of the NMOS devices and the second work function layer 222 of the PMOS devices may be substantially identical. Accordingly, the covering areas of the first metal gate 219 in the first trench 216 and the second metal gate 224 in the second trench 221 may be approximately same too. Therefore, the metal gate filling capacity may be improved, and the process requirement for the subsequently formed vias and metal interconnection may be lowered.

Further, because there may be no process for forming other thin films or structures during forming the first work function layer 217 and the second work function layer 222 of the CMOS device, and the first work function layer 217 and the second work function layer 222 are independent, a cross contamination may be prevented.

In the disclosed embodiments, it may be just an example that the work function layer of the NMOS devices is formed first, and followed by forming the work function layer of the PMOS devices. It should be understood that the process sequence may be switchable, i.e., the work function layer of the PMOS devices may be formed first, and followed by forming the work function layer of the NMOS devices.

In another embodiment, a CMOS device may be formed by the above disclosed processes and methods, the corresponding CMOS device is illustrated in FIG. 12. The CMOS device includes the semiconductor substrate 200 having the first active region 202, the second active region 203 and the shallow trench isolation regions 201 in between. The first active region 202 is the active region of the NMOS devices and the second active region 203 is the active region of the PMOS devices. The CMOS device also includes a first metal gate structure on the first active region 202 consisting of the first metal gate 219, the first work function layer 217 covering the bottom and the sidewall of the first metal gate 219, the high-K dielectric layer 213 covering the bottom and the sidewall of the first work function layer 217, and the interfacial layer 212 covering the bottom of the high-K dielectric layer 213. Further, the CMOS device includes a second metal gate structure on the second active region 203 consisting of the second metal gate 224, the second work function layer 222 covering the bottom and the sidewall of the second metal gate 224, the high-K dielectric layer 213 covering the bottom and the sidewall of the second work function layer 222, and the interfacial layer 212 covering the bottom of the high-K dielectric layer 217. Further, the CMOS device includes the third barrier layer 209 covering the surface of the semiconductor substrate 200 except the portion in the HKMG structured gate region, and the interlayer dielectric layer 210 covering the third barrier layer 209. The surface of the interlayer dielectric layer 210 is leveled with the top surface of the first metal gate 219 and the second gate 224. Further, the CMOS device also includes a plurality of sources 208a and drains 208b inside of the semiconductor substrate 200. The detailed structures and intermediate structures are described above with respect to the fabrication methods.

It should be understood that the specification is described by exemplary embodiments, but it is not necessary that each embodiment includes an independent technical solution. Those skilled in the art can understand the specification as whole and technical features in the various embodiments can be combined into other embodiments understandable to those persons of ordinary skill in the art.

The above detailed descriptions only illustrate certain exemplary embodiments of the present invention, and are not intended to limit the scope of the present invention. Any equivalent or modification thereof, without departing from the spirit and principle of the present invention, falls within the true scope of the present invention.

What is claimed is:

1. A method for fabricating a CMOS device, comprising:
providing a semiconductor substrate having a first active region and a second active region;
forming a first substitute gate electrode layer and an interlayer dielectric layer coplanar with the first substitute gate electrode layer on one surface of the semiconductor substrate;
forming a second substitute gate electrode layer with a top surface coplanar with a top surface of the interlayer dielectric layer;
forming a first barrier layer directly on: the second substitute gate electrode layer and the interlayer dielectric layer, that are on the second active region;
forming a first trench by removing the second substitute gate electrode layer on the first active region using the first barrier layer on the second active region as a mask;
forming a first work function layer on a bottom and a sidewall of the first trench of the first active region and directly on: the second substitute gate electrode layer and the interlayer dielectric layer, that are on the second active region;
forming a first metal gate by completely filling the first trench;
forming a second barrier layer directly on: the first metal gate and the interlayer dielectric layer, that are on the first active region;
forming a second trench by removing the second substitute gate electrode layer on the second active region using the second barrier formed on the first active region as a mask;
forming a second work function layer on a bottom and a sidewall of the second trench of the second active region, and directly on: the first metal gate and the interlayer dielectric layer, that are on the first active region; and
forming a second metal gate by completely fill the second trench.

2. The method according to claim 1, wherein:
the first active region is an N-type active region and the second active region is a P-type active region.

3. The method according to claim 1, wherein:
the first work function layer and the second work function layer are independently formed and made of different materials.

4. The method according to claim 1, wherein:
the first work function layer is a single layer or a multiple-stacked layer made of titanium nitride, thallium nitride or titanium aluminum alloy and the second work function layer is a single layer or a multiple-stacked layer made of titanium nitride and thallium nitride.

5. The method according to claim 1, wherein forming the first trench further includes:
removing the first substitute gate electrode layer to form trenches using the interlayer dielectric layer as a mask; and
forming a high-K dielectric layer on the bottoms and sidewalls of the trenches.

6. The method according to claim 5, before forming the high-K dielectric layer, further including:
cleaning the semiconductor substrate; and
forming an interfacial layer.

7. The method according to claim 1, before forming the trenches, further including:
performing a double sidewall spacer process to form a first sidewall spacer around the first substitute gate electrode;
forming lightly doped drains by a lightly doping ion implantation process using the first sidewall spacer and the first substitute gate layer as a mask;
performing another double sidewall spacer process to form a second sidewall spacer around the first sidewall spacer;
forming sources and drains by a heavy doping ion implantation process using a sidewall spacer including the first sidewall spacer and the second sidewall spacer and the first substitute gate electrode as a mask;
forming a third barrier layer made of silicon nitride on the semiconductor substrate;
forming an interlayer dielectric layer on the third barrier layer; and
performing a chemical mechanical polishing process to make the top surface of the first substitute gate electrode layer leveled with the top surface of the interlayer dielectric layer.

8. The method according to claim 7, wherein:
the sources and drains are alternatively formed by epitaxially growing silicon germanium for PMOS devices and silicon/silicon carbide for NMOS devices.

9. The method according to claim 1, wherein forming the first metal gate further includes:
forming a first gate metal layer on the first work function layer to completely fill the first trench; and
removing a portion of the first gate metal layer and the first work function layer on the top of the interlayer dielectric layer to make the top surface of the first metal gate leveled with the top surface of the interlayer dielectric layer.

10. The method according to claim 1, wherein forming the first metal gate further includes:
forming a second gate metal layer on the second work function layer to completely fill the second trench; and
removing a portion of the second gate metal layer and the second work function layer on the top of the interlayer dielectric layer to make the top surface of the second metal gate leveled with the top surface of the interlayer dielectric layer.

11. The method according to claim 1, wherein:
the high-K dielectric layer is made of at least one of hafnium dioxide, hafnium silicate, lanthanum oxide, lanthanum aluminum oxide, zirconium oxide, zirconium silicate, tantalum oxide, titanium oxide, barium strontium titanate, barium titanate, strontium titanate, yttrium oxide, lead scandium tantalite and lead zinc niobate.

12. The method according to claim 1, wherein:
the first gate metal layer and the second gate metal layer are made of a same material including any one of aluminum, copper, silver, gold, platinum, nickel, titanium, thallium, tantalum, tungsten, tungsten silicide, titanium tungsten alloy, titanium nitride, thallium nitride, thallium carbide, nickel platinum alloy and thallium nitrate silicate.

13. The method according to claim 1, wherein:
the first gate metal layer is a single layer or a multiple-stacked layer and the second gate metal layer is a single layer or a multiple-stacked layer.

14. The method according claim to 13, wherein:
the sequence of forming the first metal gate of the NMOS devices and the second metal gate of the PMOS devices is switchable.

15. A CMOS device, comprising:
a semiconductor substrate having a plurality of first isolation regions, a first active region and a second active region;
a plurality of sources and drains in both the first active region and the second active region;
a substitute gate dielectric layer on the surface of the semiconductor substrate;
a barrier layer on the substitute gate dielectric layer;
an interlayer dielectric layer on the third barrier layer;
a first metal gate structure on the first active region; and
a second metal gate structure on the second active region,
wherein each of the first metal gate structure and the second metal gate structure is formed sequentially by forming a substitute gate electrode layer having a top surface coplanar with a top surface of the interlayer dielectric layer; forming a trench by removing the substitute gate electrode layer; forming a work function layer on a bottom and a sidewall of the trench and directly on the substitute gate electrode layer and the interlayer dielectric layer; and forming a gate metal layer on the work function layer.

16. The CMOS device according to claim 15, wherein the first metal gate structure includes:
a first metal gate;
a first work function layer on the bottom and sidewall of the first metal gate;
a high-K gate dielectric layer on the bottom and the sidewall of the first work function layer; and
an interfacial layer between the bottom of the high-K gate dielectric layer and the semiconductor substrate.

17. The CMOS device according to claim 15, wherein the second metal gate structure includes:
a second metal gate;
a second work function layer on the bottom and sidewall of the second metal gate;
a high-K gate dielectric layer on the bottom and the sidewall of the second work function layer; and
an interfacial layer between the bottom of the high-K gate dielectric layer and the semiconductor substrate.

18. The CMOS device according to claim 17, wherein:
the first work function layer and the second work function layer are made of different materials and independently formed by once-forming processes.

19. The CMOS device according to claim 15, wherein:
the first work function layer is made of any one of titanium nitride, thallium nitride, titanium aluminum alloy and a combination thereof and the second work function is made of titanium nitride and/or thallium nitride.

20. The method according to claim 1, further including:
adjusting a cover region of the first barrier layer on the second active region to reduce an exposure resolution requirement, wherein the first barrier layer cover the entire second substitute gate electrode layer.

* * * * *